United States Patent [19]

Lynn et al.

[11] Patent Number: 4,901,255

[45] Date of Patent: Feb. 13, 1990

[54] METHOD AND APPARATUS FOR EVALUATING QUADRATURE ENCODERS

[75] Inventors: John S. Lynn; William I. Jenrette, both of Mecklenburg County, N.C.; Glenn B. Fox, Miami, Fla.

[73] Assignee: Lynn Electronics Corp., Charlotte, N.C.

[21] Appl. No.: 171,473

[22] Filed: Mar. 21, 1988

[51] Int. Cl.[4] ............... G01R 25/00; G01R 29/02
[52] U.S. Cl. .................... 364/551.01; 324/83 D; 324/83 Q; 364/486
[58] Field of Search .............. 324/83 Q, 83 D, 83 R, 324/77 R; 367/125, 127; 364/486, 487, 551.01, 514; 356/356, 373

[56] References Cited

U.S. PATENT DOCUMENTS

| | | | |
|---|---|---|---|
| 3,906,361 | 9/1975 | Nesser et al. | 367/125 |
| 3,953,794 | 4/1976 | Moore | 324/83 D |
| 4,001,682 | 1/1977 | Watt | 324/83 D |
| 4,085,362 | 4/1978 | Evans | 324/83 D |
| 4,119,910 | 10/1978 | Hayashi | 324/83 D |
| 4,128,812 | 12/1978 | Pavlis | 324/83 D |
| 4,400,664 | 8/1983 | Moore | 324/83 D |
| 4,426,620 | 1/1984 | Buchenauer | 324/83 D |
| 4,496,936 | 1/1985 | Kramer | 324/83 R |
| 4,600,994 | 7/1986 | Hayashi | 324/83 D |
| 4,636,719 | 1/1987 | Zuk et al. | 324/83 D |
| 4,700,129 | 10/1987 | Yoshizawa et al. | 324/83 D |
| 4,754,216 | 6/1988 | Wong | 324/83 D |

Primary Examiner—Parshotam S. Lall
Assistant Examiner—Kevin J. Teska
Attorney, Agent, or Firm—Daniel E. McConnell

[57] ABSTRACT

A method and apparatus for evaluating the performance of a device, such as a quadrature encoder, which generates at least two electrical wave train signals, each varying between first and second states and the two normally being out of phase one with the other. In the invention, four types of change of phase relation between the signals are distinguished from a succession of changes, the interval required for each type of phase change is timed and recorded, and a predetermined plurality of sets of records are accumulated. The mean time interval for a change of phase relation between the two wave train signals is computed from the accumulated plurality of sets of records and compared with the accumulated sets of records of timed intervals for determining the one type of phase change for which the difference from the mean time interval is the greatest. A number indicative of the phase duration of that type of change of phase which has the greatest difference from the mean time interval is then computed and used in deriving an encoder quality signal representative of the performance of the quadrature encoder generating the wave train signals.

24 Claims, 4 Drawing Sheets

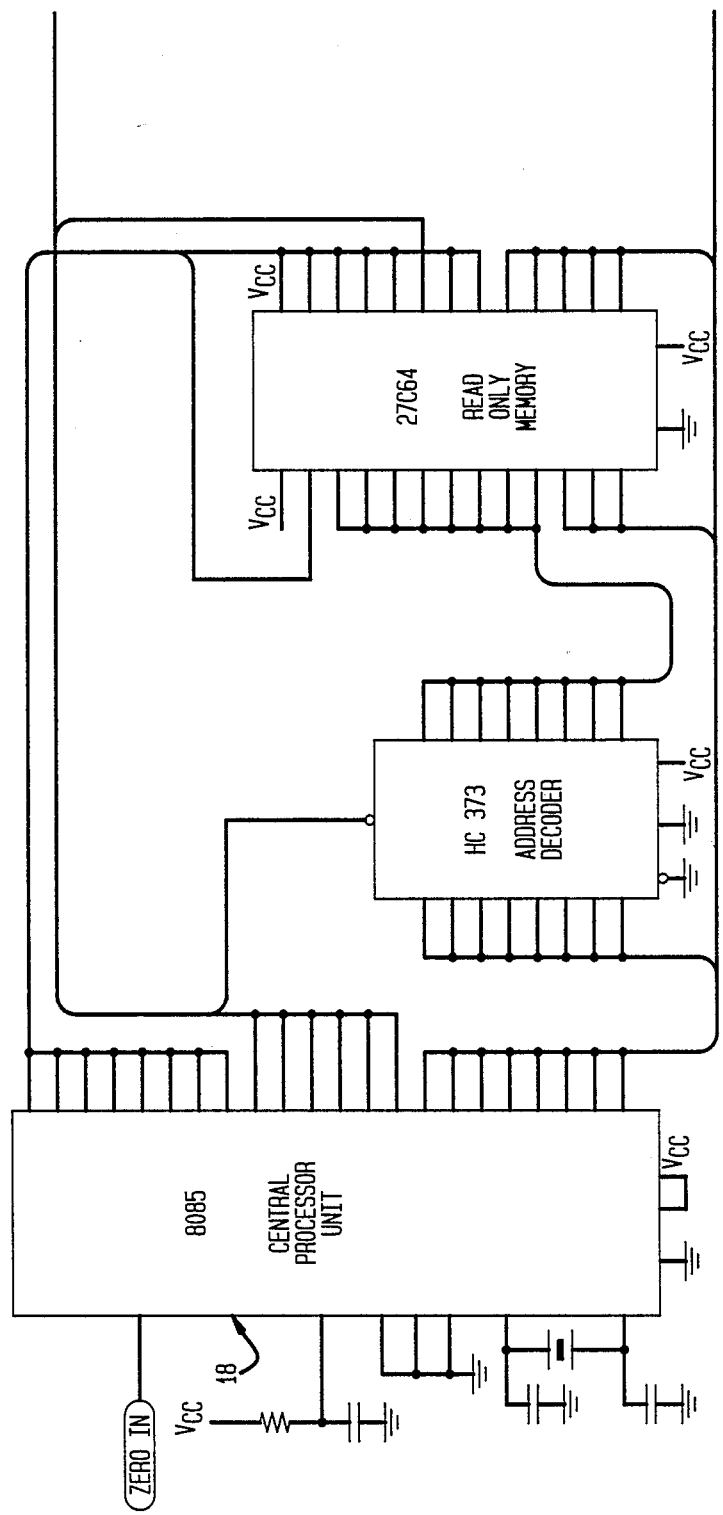

METHOD AND APPARATUS FOR EVALUATING QUADRATURE ENCODERS

FIELD AND BACKGROUND OF INVENTION

This invention relates to a method and apparatus for evaluating the performance of devices which generate at least two electrical wave train signals, with each wave train signal varying between first and second states and the two wave train signals normally being out of phase one with the other. One class of such devices are known as quadrature encoders, used to sense the movement of mechanical components such as rotating shafts or laterally moving table or the like, and are common in certain types of machine tools.

Quadrature encoders are well known, commercially available devices. The interested reader is referred to the literature available from suppliers of such devices, such as BEI Electronics of Goleta, Calif. Typically, such devices have one or more optical gratings formed by lines printed or etched onto transparent material such as glass and an associated pair of light source and sensor devices capable of detecting and responding to the lines. The devices are arranged for movement of the grating or source and sensor on movement of a mechanical component, such as the rotation of a shaft or the translation of a table or the like. As a result of movement, at least two wave train signals are generated which are representative of the movement which occurs. The wave train signals can be interpreted by appropriate electronic circuitry and provide position information for control of a mechanical apparatus such as a machine tool. Such technology is, as mentioned, well known and is not within the scope of the present invention.

A problem in the use of such devices which generate wave train signals used to control positioning servo systems and the like is that of assuring that the quality of the signals generated and emitted is sufficiently high to provide assurance that desired or necessary accuracy is maintained. Thus, in the specific case of quadrature encoders, a low quality signal generated by a quadrature encoder will result in inaccurate manufacture by an associated machine tool. As used herein, "low quality" refers to a signal, or more particularly a pair or set of related wave train signals, which lacks a designed and anticipated correlation. In the specific case of a quadrature encoder, the usual design criteria is that the two wave train signals have a phase relation, one to the other, of ninety degrees. Departure from that criteria is a degradation which, should it extend into an undesirably low range, renders the device unacceptable. More particularly, one way of expressing the criteria relates the rate of signal generation to mechanical movement as a frequency response for an encoder, with a typical anticipated response being on the order of 100 kilohertz. As the phase shift between signals approaches zero, the frequency response decreases. For example, should the design criteria a ninety degree phase shift degrade to a forty five degree shift, then the effective response of the encoder is reduced by fifty percent to 50 kilohertz (in the example given here).

While phase measuring instruments have been proposed heretofore, such as in Nessler U.S. Pat. No. 3,906,361, no such instrument has been proposed which addresses the determination of the quality of signal generated by a device of the general type described above.

BRIEF DESCRIPTION OF INVENTION

With the foregoing in mind, it is an object of this invention to accomplish the evaluation of the quality of a device of the type described by a method which derives and displays a quality signal indicative of the quality of the wave train signals generated by the device. In realizing this object, the present invention contemplates distinguishing among four types of phase changes which occur between two out of phase wave train signals, selecting that one type of change which departs furthest from the mean time of all such types of change, and displaying a quality signal which indicates the extent of such deviation.

Yet a further object of this invention is to provide an apparatus which may be readily connected with a device of the type described, such as a quadrature encoder, for rapidly and easily determining and displaying a quality signal by which the performance of the device is evaluated. In realizing this object of the invention, an apparatus is contemplated which has processor means for operative connection with an encoder and for receiving the wave train signals generated by the encoder. The processor, with associated gate and register means, distinguishes sets of signals representing four types of phase relation changes between at least two signals and computes, compares and derives a signal indicative of the greatest deviation of any such phase change from the mean phase relation for all four types.

BRIEF DESCRIPTION OF DRAWINGS

Some of the objects of the invention having been stated, other objects will appear as the description proceeds, when taken in connection with the accompanying drawings, in which:

FIG. 3, divided into FIG. 3A and FIG. 3B, is an alternate, more detailed, schematic representation of an apparatus in accordance with this invention.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
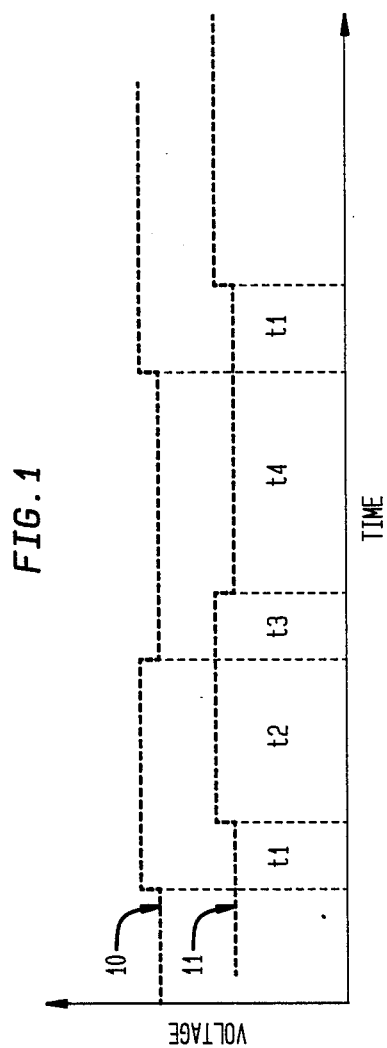
FIG. 1 is a schematic representation of a pair of signals generated by a device of the type to be evaluated by the method and apparatus of this invention.

Referring now more particularly to the drawings, FIG. 1 illustrates a pattern of two wave train signals 10, 11 such as are generated by devices of the types with which this invention is concerned. Each signal 10, 11 is an electrical signal varying over time between two voltage levels and generally having the form of a square wave. Such wave train signals are generated by quadrature encoders such as those described briefly hereinabove. The two signals 10, 11 have a particular phase relation between them, and four separate types of changes between them may be identified. For a first time interval (at the extreme left side of FIG. 1), both signals are low. The one signal 10 goes high and one signal is high while the other is low. This state continues for a time interval identified as t1, after which the second signal 11 goes high. This state then continues for a time interval identified as t2, after which the first signal 10 goes low. This state then continues for a time interval identified as t3, after which the second signal goes low to return the pattern to its first state. This state continues for an interval identified as t4, and the pattern then repeats.

While described here with particular reference to a pair of signals in square wave form, it will be understood by a knowledgeable reader that some devices generate more than a single pair of signals and signals which have wave forms other than square waves. Thus, some quadrature encoders provide inverse signals and multiple pairs, while others provide sine wave signals. This invention contemplates that multiple pairs of signals may be generated and evaluated, and further that, by appropriate technology known to persons skilled in the art, wave train signals in sine wave or other complex wave forms can be converted into square wave form for analysis or otherwise handled in the ways described hereinafter as characteristic of this invention. Accordingly, while specific illustrations are given, the broader application and scope of this invention is to be noted.

Figure 2:
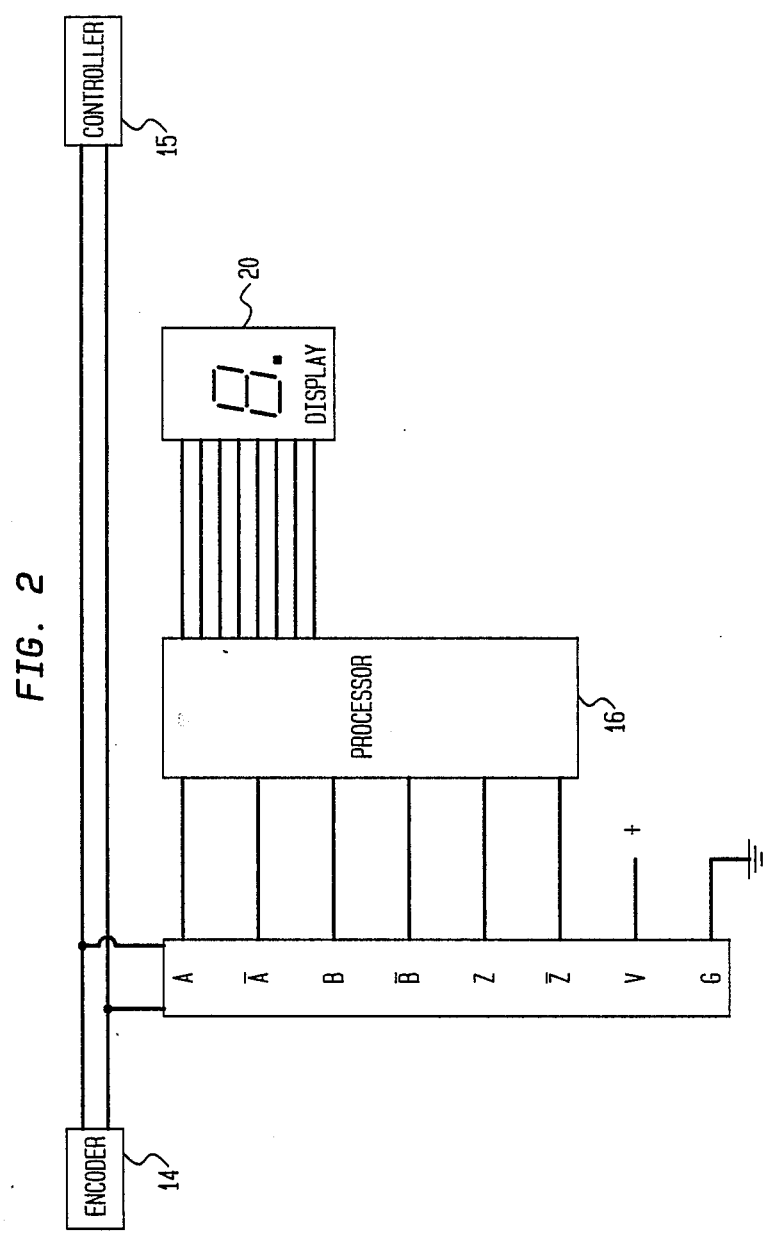
FIG. 2 is a schematic representation of an apparatus in accordance with this invention.
Figure 3B:
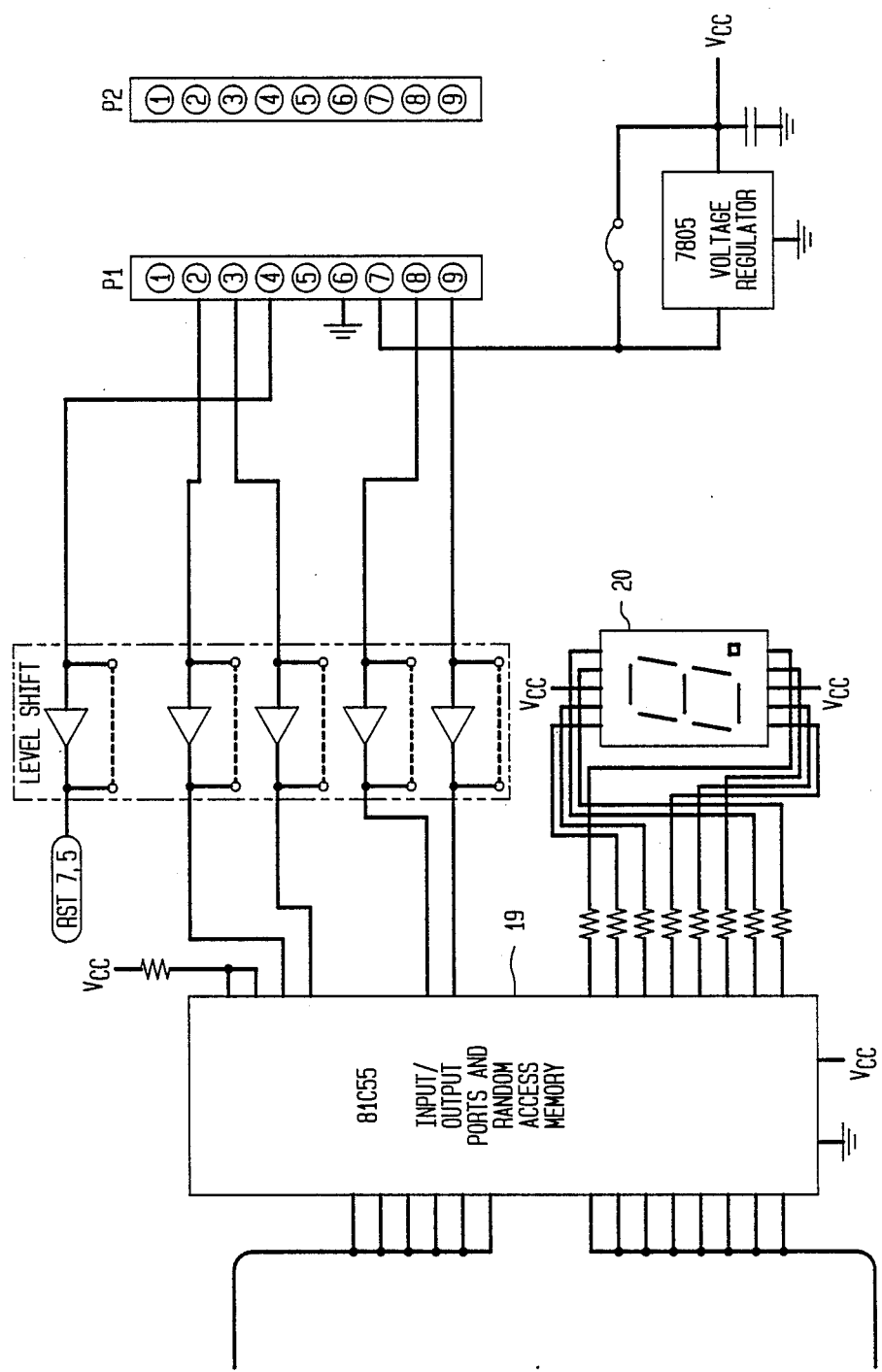

The apparatus according to this invention, as shown schematically in FIGS. 2 and 3, is adapted for connection between an encoder 14 and a controller 15 which normally receives wave train signals from the encoder and uses them to read and display or control the physical position of a mechanical component. Both the encoder 14 and the controller 15 are well known to persons of skill in the appropriate arts, and neither forms any direct part of the inventive disclosure hereinafter. They are, however, appropriate to an understanding of one environment for application of the invention.

The apparatus of this invention is contemplated as capable of evaluating the performance of a quadrature encoder which generates two electrical wave train signals indicative of the rotation of a shaft, generally as described above with reference to FIG. 1. The apparatus is equally capable of evaluating the performance of other devices generating wave train signals and of encoders coupled for sensing translation. It is only appropriate that each wave train signal vary between first and second states and the two wave train signals normally be out of phase one with the other. The contemplated apparatus has an appropriate electronic processor means and associated gate and register means for performing a series of functions under the control of appropriate instructions.

Those functions include distinguishing, from a succession of changes of the two wave train signals between respective first and second states, four types of change of phase relation between the two wave train signals, as described above with reference to FIG. 1. As the types of changes are distinguished, the interval required for each type of phase change is timed, recorded in a register and accumulated into a predetermined plurality of sets of records of timed intervals for each of the four types of change of phase relation between the two wave train signals. Means are provided for sensing the presence of each of the two wave train signals and for responding to the absence of the sensed presence of one wave train signal by interrupting the accumulation of sets of records and generating and displaying an error signal. As another way of assuring that accurate information is developed and processed, means are provided for sensing the occurrence of simultaneous changes in state in the two wave train signals and for responding to a sensed occurrence of such changes by interrupting the accumulation of sets of records and generating and displaying an error signal. These errors, if passed unnoticed, might permit an encoder having a scratched or partially obscured optical grating to be deemed acceptable. In order to guard against erroneous determinations occurring where an encoder has been reversed during evaluation, means are provided for sensing the sequence of changes in state in the two wave train signals and for responding to a sensed occurrence of a reversal in such sequence by interrupt in the accumulation of sets of records.

Where the accumulation of sets of records has proceeded normally, the processor, gate and register means senses the accumulation of the predetermined plurality of sets of records and computes from the accumulated plurality of sets of records the mean time interval for a change of phase relation between the two wave train signals. By way of example, the accumulation of sets of records may accumulate a set of sixty four successive changes and the time intervals required for those changes. The number accumulated is chosen to be a number divisible by four and is checked for that divisibility in order to assure that the accumulated set is proper. At each change, the states of the signals and the time since the last change are recorded. Should it be determined that the time interval is less than a redetermined interval, then the attempted accumulation has occurred with an excessively fast rate of change of the phase relations between the signals and any attempted evaluation is likely to be erroneous. Accordingly, any such accumulation is discarded without proceeding further and a new sampling begun. Similarly, if the time interval between phase changes is excessive, the attempted accumulation has occurred with an excessively slow rate of change of the phase relations between the signals and any attempted evaluation is likely to be erroneous. Accordingly, any such accumulation is discarded without proceeding further and a new sampling begun.

Where the specific device under evaluation is one which generates inverse signals, the present invention contemplates that the two signals which are supposedly inverse one to the other may be compared. If the relationship is not properly inverse, then an error signal may be generated and displayed in order that an evaluator may know that the device is unacceptable.

In computing the mean time interval, the processor sums the time intervals for all records registered and then divides by the predetermined number of records accumulated. That computed mean time is then compared by an appropriate means with the accumulated sets of records of timed intervals and the one type of phase change for which the difference from the mean time interval is the greatest is determined. Means are then provided for computing a number indicative of the phase duration of that type of change of phase which has the greatest difference from the mean time interval and for deriving, from the record of timed intervals which has the greatest difference from the mean time interval and the computed mean time interval, an encoder quality signal representative of the performance of the quadrature encoder generating the wave train signals. Stated in mathematical equations and referring to the illustration in FIG. 1, the computations include:

$$T\text{mean} = \frac{t1 + t2 + t3 + t4}{4}$$

$$\text{delta } 1 = t1 - T\text{mean} \quad \text{delta } 2 = t2 - T\text{mean}$$

$$\text{delta } 3 = t3 - T\text{mean} \quad \text{delta } 4 = t4 - T\text{mean}$$

delta maximum = largest absolute value of delta 1 through delta 4

$$\text{quality signal} = \frac{(T\text{mean} - \text{delta maximum})(90)}{T\text{mean}}$$

Thus the quality signal will be understood to be a computed number representative of the phase difference least likely to be acceptable and may be displayed as a one digit number (on a scale of from 0 to 9) or a two digit number (on a scale of from 0 to 99) where a threshold of acceptability may be a quality of (for example only) 6 or 60. As will be understood, the maximum attainable quality should be a 9 or 90.

The process of computation done by the electronic circuitry as described hereinabove may include certain rounding and smoothing steps where appropriate. The computation is accomplished using a processor means generally indicated at 16 in FIG. 2, which may be distributed among a number of known types of microcircuits or "chips" or possibly, through the use of large scale integration technology or the like, formed into a single dedicated purpose microcomputer. The schematic of FIG. 3 illustrates the distribution of certain functions among such a plurality of known devices, including an 8085 processor indicated at 18 and an 81C55 display driver incorporating random access memory and indicated at 19.

In and event, the quality signal derived by operation of the apparatus as described to this point is supplied to a suitable means for displaying the encoder quality signal. In the form illustrated, such a means takes the form of a display device 20 capable of showing a single digit in the range of from zero to nine, and thus adaptable to the range indicated above. Where a double digit indication is to be given, a second such display device is provided.

In use, the apparatus of this invention is connected with a wave train signal generating device or is interposed between a quadrature encoder and a controller as illustrated in FIG. 2. Thereafter, the encoder is caused to generate signals, as by spinning the shaft of the encoder or moving the movable element of a translating encoder. As such mechanical movement occurs, at least two wave train signals are generated and supplied to the apparatus of this invention.

The performance of the device or encoder is then evaluated by the steps of first distinguishing, from a succession of changes of the two wave train signals between respective first and second states, four types of change of phase relation between the two wave train signals. The method then proceeds by timing and recording the interval required for each type of phase change, and accumulating a predetermined plurality of sets of records of timed intervals for each of the four types of change of phase relation between the two wave train signals. As part of the process of accumulating, and in order to provide for the possibilities of error, the method includes sensing the presence of each of the two wave train signals, and responding to the absence of the sensed presence of one wave train signal by interrupting the accumulation of sets of records and generating and displaying an error signal. For the same reasons, the method may also include sensing the occurrence of simultaneous changes in state in the two wave train signals, and responding to a sensed occurrence of such changes by interrupting the accumulation of sets of records and generating and displaying an error signal. In any event the method includes sensing the sequence of changes in state in the two wave train signals, and responding to a sensed occurrence of a reversal in such sequence by interrupting the accumulation of sets of records.

When the accumulation of the predetermined plurality of sets of records has been sensed, the method then proceeds by computing from the accumulated plurality of sets of records the mean time interval for a change of phase relation between the two wave train signals; comparing the computed mean time interval with the accumulated sets of records of timed intervals and determining the one type of phase change for which the difference from the mean time interval is the greatest; computing a number indicative of the phase duration of that type of change of phase which has the greatest difference from the mean time interval and deriving, from the record of timed intervals which has the greatest difference from the mean time interval and the computed mean time interval, and encoder quality signal representative of the performance and of quadrature encoder generating the wave train signals. That encoder quality signal is then used to drive a display for displaying the encoder quality signal.

As will be appreciated by persons skilled in the arts of data communication, it is possible to make, and the present invention contemplates making, provision for communication of the quality signal to a remote sensing location, such as by the inclusion of an RS232 communication port in the apparatus of this invention. It is also possible, and contemplated by this invention, to process the data derived as described hereinabove in such ways as to determine other characteristics of encoders or the like, such as the distance through which the coupled mechanical movement has moved, or the direction, velocity, acceleration or jerk of such movements.

In the drawings and specifications there has been set forth a preferred embodiment of the invention and, given uses terminology in a generic and descriptive sense only and not for purposes of limitation.

What is claimed is:

1. A method for evaluating the performance of a device which generates two electrical wave train signals, each wave train signal varying between first and second states and the two wave train signals normally being out of phase one with the other, the method comprising the steps of: distinguishing, from a succession of changes of the two wave train signals between respective first and second states, four types of change of phase relation between the two wave train signals; timing and recording a time interval required for each type of phase change; accumulating a plurality of sets of records of timed intervals for each of the four types of change of phase relation between the two wave train signals; computing from the accumulated plurality of sets of records the mean time interval for a change of phase relation between the two wave train signals; comparing the computed mean time interval with the accumulated sets of records of timed intervals and determining the one type of phase change for which the difference from the mean time interval is the greatest; deriving, from the record of timed intervals which has the greatest difference from the mean time interval and the computed mean time interval, a quality signal representative of the performance of the device generating the wave train signals; and displaying the quality signal.

2. A method for evaluating the performance of a quadrature encoder which generates two electrical wave train signals indicative of the movement of a mechanical component, each wave train signal varying between first and second states and the two wave train signals normally being out of phase one with the other, the method comprising the steps of:

receiving the two wave train signals at a processor, distinguishing, from the succession of changes of the signals between respective first and second states, sets of four types of change of phase relation between the two signals, timing and recording a time interval required for each type of phase change in each set, accumulating a plurality of sets of records of timed intervals for phase changes, computing from the accumulated plurality of sets of records the mean time interval for a phase change, comparing the computed mean time interval with the accumulated sets of records of timed intervals and determining the type of phase change for which the difference from the mean time interval is the greatest, deriving from the record of timed intervals which has the greatest difference from the mean time interval and the computed mean time interval an encoder quality signal representative of the performance of the quadrature encoder generating the wave train signals, and displaying the encoder quality signal.

3. A method according to one claim 1 or claim 2 wherein the step of deriving a quality signal comprises computing a number indicative of the phase duration of that type of change of phase which has the greatest difference from the mean time interval.

4. A method according to claim 3 wherein the step of deriving a quality signal further comprises comparing the computed phase duration indicating number with a predetermined threshold number; determining from the comparison the acceptability and unacceptability of the performance; and generating a display signal indicative of one of two states of acceptable and unacceptable performance.

5. A method according to claim 3 wherein the step of deriving a quality signal further comprises deriving from the computed phase duration indicating number a display signal which represents a single digit number indicative of an average value over time of a number of degrees of phase angle of that type of change of phase which has the greatest difference from the mean time interval.

6. A method according to one of claim 1 or claim 2 further comprising distinguishing, from a succession of changes of the two wave train signals between respective first and second states, the rate at which changes of phase relation between the two wave train signals are occurring.

7. A method according to claim 6 further comprising sensing an occurrence of a rate of changes in phase relation between the two wave train signals which is outside a predetermined range of rates, and responding to a sensed occurrence by interrupting the accumulation of sets of records and generating and displaying an error signal.

8. A method according to claim 6 further comprising determining a numerical value for the rate of changes in phase relation and displaying the determined numerical value.

9. A method according to one of claim 1 or claim 2 further comprising sensing the presence of each of the two wave train signals, and responding to the absence of the sensed presence of one wave train signal by interrupting the accumulation of sets of records and generating and displaying an error signal.

10. A method according to one of claim 1 or claim 2 further comprising sensing the occurrence of simultaneous changes in state in the two wave train signals, and responding to a sensed occurrence of such changes by interrupting the accumulation of sets of records and generating and displaying an error signal.

11. A method according to one of claim 1 or claim 2 further comprising sensing the sequence of changes in state in the two wave train signals, and responding to a sensed occurrence of a reversal in such sequence by interrupting the accumulation of set of records 12. A method for evaluating the performance of a quadrature encoder which generates two electrical wave train signals indicative of the rotation of a shaft, each wave train signal varying between first and second states and the two wave train signals normally being out of phase one with the other, the method comprising the steps of: distinguishing, from a succession of changes of the two wave train signals between respective first and second states, four types of change of phase relation between the two wave train signals; timing and recording a time interval required for each type of phase change; accumulating a predetermined plurality of sets of records of timed intervals for each of the four types of change of phase relation between the two wave train signals; sensing the presence of each of the two wave train signals; responding to the absence of the sensed presence of one wave train signal by interrupting the accumulation of sets of records and generating and displaying an error signal; sensing the occurrence of simultaneous changes in state in the two wave train signals; responding to a sensed occurrence of such changes by interrupting the accumulation of sets of records and generating and displaying an error signal; sensing the sequence of changes in state in the two wave train signals; responding to a sensed occurrence of a reversal in such sequence by interrupting the accumulation of sets of records; sensing the accumulation of the predetermined plurality of sets of records; computing from the accumulated plurality of sets of records the mean time interval for a change of phase relation between the two wave train signals; comparing the computed mean time interval with the accumulated sets of records of timed intervals and determining the one type of phase change for which the difference from the mean time interval is the greatest; computing a number indicative of the phase duration of that type of change of phase which has the greatest difference from the mean time interval and deriving, from the record of timed intervals which has the greatest difference from the mean time interval and the computed mean time interval, an encoder quality signal representative of the performance of the quadrature encoder generating the wave train signals; and displaying the encoder quality signal.

13. A method according to claim 12 wherein the step of deriving an encoder quality signal further comprises comparing the computed phase duration indicating number with a predetermined threshold number; determining from the comparison the acceptability and unacceptability of the encoder performance; and generating a display signal indicative of one of two states of acceptable and unacceptable performance.

14. A method according to claim 12 wherein the step of deriving an encoder quality signal further comprises deriving from the computed phase duration indicating number a display signal which represents a single digit number indicative of an average value over time of a number of degrees of phase angle of that type of change of phase which has the greatest difference from the mean time interval.

15. An apparatus for evaluating the performance of a device which generates two electrical wave train signals, each wave train signal varying between first and second states and the two wave train signals normally being out of phase one with the other, the apparatus comprising:

processor means for receiving the wave train signals generated by the first mentioned device and for distinguishing, from a succession of changes of the two wave train signals between respective first and second states, four types of change of phase relation between the two wave train signals;

gate and register means operatively connected with said processor means for timing and recording the interval required for each type of phase change and for accumulating a plurality of sets of records of timed intervals for each of the four types of change of phase relation between the two wave train signals;

said processor means computing from the accumulated plurality of sets of records the mean time interval for a change of phase relation between the two wave train signals, comparing the computed mean time interval with the accumulated sets of records of timed intervals and determining the one type of phase change for which the difference from the mean time interval is the greatest, and deriving, from the record of timed intervals which has the greatest difference from the mean time interval and the computed mean time interval, a quality signal representative of the performance of the device generating the wave train signals; and means operatively connected with said processor means for displaying the quality signal.

16. An apparatus for evaluating the performance of a quadrature encoder which generates two electrical wave train signals indicative of the movement of a mechanical component, each wave train signal varying between first and second states and the two wave train signals normally being out of phase one with the other, the apparatus comprising:

processor means for receiving the two wave train signals and for distinguishing, from the succession of changes of the signals between respective first and second states, sets of four types of change of phase relation between the two signals, gate and register means operatively connected with said processor means for timing and recording the interval required for each type of phase change in each set and for accumulating a plurality of sets of records of timed intervals for phase changes, said processor means functioning for computing from the accumulated plurality of sets of records the mean time interval for a phase change; for comparing the computed mean time interval with the accumulated sets of records of timed intervals and determining the type of phase change for which the difference from the mean time interval is the greatest; and for deriving from the record of timed intervals which has the greatest difference from the mean time interval and the computed mean time interval an encoder quality signal representative of the performance of the quadrature encoder generating the wave train signals, and means operatively connected with said processor means for displaying the encoder quality signal.

17. An apparatus according to one of claim 15 or claim 16 wherein said processor means in deriving a quality signal computes a number indicative of the phase duration of that type of change of phase which has the greatest difference from the mean time interval.

18. An apparatus according to claim 17 wherein said processor means in deriving a quality signal functions for comparing said computed phase duration indicating number with a predetermined threshold number; determines from the comparison the acceptability and unacceptability of the performance; and generates a display signal indicative of one of two states of acceptable and unacceptable performance.

19. An apparatus according to claim 17 wherein said processor means in deriving a quality signal derives from the computed phase duration indicating number a display signal which represents a single digit number indicative of an average value over time of a number of degrees of phase angle of that type of change of phase which has the greatest difference from the mean time interval.

20. An apparatus according to one of claim 15 or claim 16 wherein said processor means functions for distinguishing, from a succession of changes of the two wave train signals between respective first and second states, the rate at which changes of phase relation between the two wave train signals are occurring.

21. An apparatus according to claim 20 wherein said processor means functions for sensing an occurrence of a rate of changes in phase relation between the two wave train signals which is outside a predetermined range of rates, and responds to a sensed occurrence by interrupting the accumulation of sets of records and generating and displaying an error signal.

22. An apparatus according to one of claim 15 or claim 16 wherein said processor means functions for sensing the presence of each of the two wave train signals, and for responding to the absence of the sensed presence of one wave train signal by interrupting the accumulation of sets of records and generating and displaying an error signal.

23. An apparatus according to one of claim 15 or claim 16 wherein said processor means functions for sensing the occurrence of simultaneous changes in state in the two wave train signals, and for responding to a sensed occurrence of such changes by interrupting the accumulation of sets of records and generating and displaying an error signal.

24. An apparatus according to one of claim 15 or claim 16 wherein said processor means functions for sensing the sequence of changes in state in the two wave train signals, and for responding to a sensed occurrence of a reversal in such sequence by interrupting the accumulation of sets of records.

* * * * *